US 7,916,559 B2

(12) United States Patent
Lee

(10) Patent No.: US 7,916,559 B2
(45) Date of Patent: Mar. 29, 2011

(54) SEMICONDUCTOR MEMORY DEVICE AND OPERATION METHOD THEREOF

(75) Inventor: Do-Yun Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 179 days.

(21) Appl. No.: 12/266,872

(22) Filed: Nov. 7, 2008

(65) Prior Publication Data

US 2009/0316502 A1 Dec. 24, 2009

(30) Foreign Application Priority Data

Jun. 24, 2008 (KR) .................. 10-2008-0059638

(51) Int. Cl.
*G11C 7/00* (2006.01)

(52) U.S. Cl. ........ 365/193; 365/206; 365/205; 365/196; 365/189.02; 365/230.02; 365/230.06

(58) Field of Classification Search .................. 365/193, 365/206, 205, 196, 189.02, 230.02, 230.06
See application file for complete search history.

(56) References Cited

U.S. PATENT DOCUMENTS

| 6,166,986 A | 12/2000 | Kim |
| 6,965,539 B2 * | 11/2005 | Lee ................... 365/185.17 |
| 2008/0008011 A1 | 1/2008 | Moon et al. |

FOREIGN PATENT DOCUMENTS

| KR | 1020030049187 A | 6/2003 |
| KR | 1020070091451 A | 9/2007 |

OTHER PUBLICATIONS

Notice of Preliminary Rejection issued from Korean Intellectual Property Office on Nov. 23, 2009.
Notice of Allowance issued from Korean Intellectual Property Office on Jan. 28, 2010.

* cited by examiner

*Primary Examiner* — Thong Q Le
(74) *Attorney, Agent, or Firm* — IP & T Group LLP

(57) ABSTRACT

There is provided a semiconductor memory device including: a source strobe signal generating unit configured to generate a source strobe signal having a first or a second activation width corresponding to a normal mode and a bank grouping mode; a final strobe signal generating unit configured to, in the normal mode, expand the first activation width and generate a final strobe signal having the expanded first activation width, and in the bank grouping mode, maintain the second activation width and generate the final strobe signal having the second activation width; and a sense amplifying unit configured to sense, amplify and output data applied through a data line in response to the final strobe signal.

19 Claims, 4 Drawing Sheets

SEMICONDUCTOR MEMORY DEVICE AND OPERATION METHOD THEREOF

CROSS-REFERENCE TO RELATED APPLICATION

This application claims priority of Korean patent application number 10-2008-0059638, filed on Jun. 24, 2008 which is incorporated by reference in its entirety.

BACKGROUND OF THE INVENTION

The subject matter relates to a semiconductor design technology, and more particularly, to a semiconductor memory device that generates a strobe signal for sensing and amplifying input and output by responding to a main strobe signal, and an operation method thereof.

In general, a semiconductor memory device including a double data rate synchronous DRAM (DDR SDRAM) generates a main strobe signal in response to a column address strobe (CAS) signal as a column command. The main strobe signal becomes a source signal to generate a column based main signal as a pulse signal having an activation width corresponding to an external clock signal. In the semiconductor memory device, a column selection signal, a write drive enable signal, a local input/output line pre-charging signal and an input/output sense amplifying strobe signal and the like are generated by using the main strobe signal. Here, the column selection signal, the write drive enable signal, the local input/output line pre-charging signal and the input/output sense amplifying strobe signal have the same activation width.

FIG. 1 is a circuit diagram showing input/output operations of a conventional semiconductor memory device.

Referring to FIG. 1, inspecting briefly a reading operation. If a word line WL selected by decoding a row address supplied from an outside during the reading operation is activated, a cell transistor T1 of a semiconductor memory cell 110 turns on and a charge for data stored in a cell capacitor C1 is charge shared to pre-charged main/sub bit lines BL and /BL. The main bit line BL and the sub bit line /BL have a fine voltage difference through a charge sharing operation. For reference, a pre-charged voltage level is at half the voltage level of a core voltage as an inner voltage.

Thereafter, a bit line sense amplifier 120 senses fine voltages of the main bit line BL and the sub bit line /BL corresponding to the main bit line BL to amplify the sensed fine voltages. In other words, if a potential of the main bit line BL is higher than a potential of the sub bit line /BL, the main bit line BL is amplified to a pull-up power voltage RTO and the sub bit line is amplified to a pull-down power voltage SB. Whereas, if a potential of the main bit line is lower than that of the sub bit line, the main bit line BL is amplified to the pull-down power voltage SB and the sub bit line /SB is amplified to the pull-up power voltage RTO.

On the other hand, if a column selection unit 130 is activated in response to a column selection signal YI selected by decoding a column address applied from an outside, the main and sub bit lines BL and /BL are connected to main and sub segment input/output lines SIO and /SIO. That is, the data amplified at the main bit line BL is transferred to the main segment input/output line SIO and the data amplified at the sub bit line /BL is transferred to the sub segment input/output line /SIO. Thereafter, if an input/output switching unit 140 is activated in response to an input/output control signal CTR_IO, the main and sub segment input/output segment lines are connected to main and sub local input/output lines LIO and /LIO. That is, the data transferred to the main segment input/output line SIO is transferred to the main local input/output line LIO and the data transferred to the sub segment input/output line /SIO is transferred to the sub local input/output line /LIO. A read driving unit 150 drives a global input/output line GIO according to the data transferred through the main and sub local input/output lines LIO and /LIO.

Finally, the data stored at the memory cell 110 is transferred to the main and sub segment input/output lines SIO and /SIO at the main and sub bit lines BL and /BL, to the main and sub local input/output lines LIO and /LIO at the main and sub segment input/output lines SIO and /SIO and to the global input/output line GIO at the main and sub local input/output lines LIO and /LIO.

Meanwhile, the data applied from an outside during a writing operation is transferred in an opposite direction of the reading operation. That is, the data applied from the external is transferred to the main and sub local input/output lines LIO and /LIO through a write driving unit 160 at the global input/output line GIO, to the main and sub segment input/output lines SIO and /SIO at the main and sub local input/output lines LIO and /LIO and to the main and sub bit lines BL and /BL at the main and sub segment input/output lines SIO and /SIO. The transferred data is finally stored in the cell memory.

For reference, the data transferred through each line reflect an RC loading by a plurality of resistors R and capacitors C shown in FIG. 1.

FIG. 2 is a diagram showing the read driving unit 150 of FIG. 1.

Referring to FIG. 2, the read driving unit 150 includes an input/output sense amplifying unit 210 and a main driving unit 230.

The input/output sense amplifying unit 210 sense amplifies the signals applied to the main and sub local input/output lines LIO and /LIO in response to an input/output sense amplifying strobe signal STB_IOSA and generates pull-up and pull down control signals CTR_PU and CTR_PD corresponding thereto. That is, the pull-up control signal CTR_PU is activated in response to the data applied to the main local input/output line LIO and the pull-down control signal CTR_PD is activated in response to the data applied to the sub local input/output line /LIO. Herein, the input/output sense amplifying strobe signal STB_IOSA is generated by using the main strobe signal (not shown) described above and the input/output sense amplifying unit 210 performs the sense amplifying operation in response to the input/output sense amplifying strobe signal STB_IOSA.

A main driving unit 230 drives the global input/output line GIO in response to the pull-up and pull-down control signals CTR-PU and CTR_PD. That is, the main driving unit 230 performs a pull-up operation to the global input/output line in response to the pull-up control signal CTR_PU and performs a pull-down operation to the global input/output line GIO in response to the pull-down control signal CTR_PD.

Herein, the input/output sense amplifying strobe signal STB_IOSA will be examined. As described above, the input/output sense amplifying strobe signal STB_IOSA is a signal generated in response to the main strobe signal. That is, if the main strobe signal has an activation width of 1 tCK, the input/output sense amplifying strobe signal STB_IOSA also has an activation width of 1 tCK. Therefore, the input/output sense amplifying unit 210 operating in response to the input/output sense amplifying strobe signal STB_IOSA also performs the sense amplifying operation during the activation time of 1 tCK.

On the other hand, an external clock signal has been gradually designed to operate at high frequency for increasing an operation speed of the semiconductor memory device. That is, the time corresponding to the 1 tCK has been gradually shortened. As the time corresponding to the 1 tCK of the external clock signal becomes short, accordingly an activation width of the main strobe signal becomes narrow, an activation width of the input/output sense amplifying strobe signal STB_IOSA becomes narrow, and a time for performing a sense amplifying operation of the input/output sense amplifying unit 210 decreases. Thus, the time to sense amplify the data applied to the main and sub local input/output lines LIO and /LIO as well as the time to drive the global input/output line GIO becomes short. As a result, if the semiconductor memory device operates at a high frequency, but the data does not perform a full swing to the global input/output line GIO, this can cause errors in the semiconductor memory device.

SUMMARY OF THE INVENTION

Embodiments of the present invention are directed to providing an input/output sense amplifying circuit that is capable of performing a sense amplifying operation for an optimum period of time by increasing an activation width of an input/output sense amplifying strobe signal as being proposed, to solve the problems of a prior art.

Embodiments of the present invention are directed to providing a semiconductor memory device that is capable of controlling an activation width of an input/output sense amplifying strobe signal according to a normal mode and a bank grouping mode.

In accordance with an aspect of the present invention, there is provided a semiconductor memory device including: a source strobe signal generating unit configured to generate a source strobe signal having a first or a second activation width corresponding to a normal mode and a bank grouping mode; a final strobe signal generating unit configured to, in the normal mode, expand the first activation width and generate a final strobe signal having the expanded first activation width, and in the bank grouping mode, maintain the second activation width and generate the final strobe signal having the second activation width; and a sense amplifying unit configured to sense, amplify and output data applied through a data line in response to the final strobe signal.

In accordance with another aspect of the present invention, there is provided a method for driving a semiconductor memory device, including: expanding an activation width of a source strobe signal having a first activation width corresponding to a normal mode and outputting the source strobe signal having an expanded first activation width as a final strobe signal; maintaining a second activation width of the source strobe signal corresponding to a bank grouping mode and outputting the source strobe signal having the second activation width as the final strobe signal; and sensing, amplifying and outputting data in response to the final strobe signal.

In accordance with another aspect of the present invention, there is provided an input/output sense amplifying circuit including: a pulse width expansion unit configured to generate an input/output sense amplifying strobe signal by expanding an activation width of a received main strobe signal; and a sense amplifying unit configured to amplify and output the data applied to a local input/output line in response to the input/output sense amplifying strobe signal.

DETAILED DESCRIPTION

Hereinafter, in order to describe the subject matter in detail to a degree that those skilled in the art can easily implement the present invention, a preferred embodiment of the present invention will be described in detail with reference to the accompanying drawings.

Figure 1:
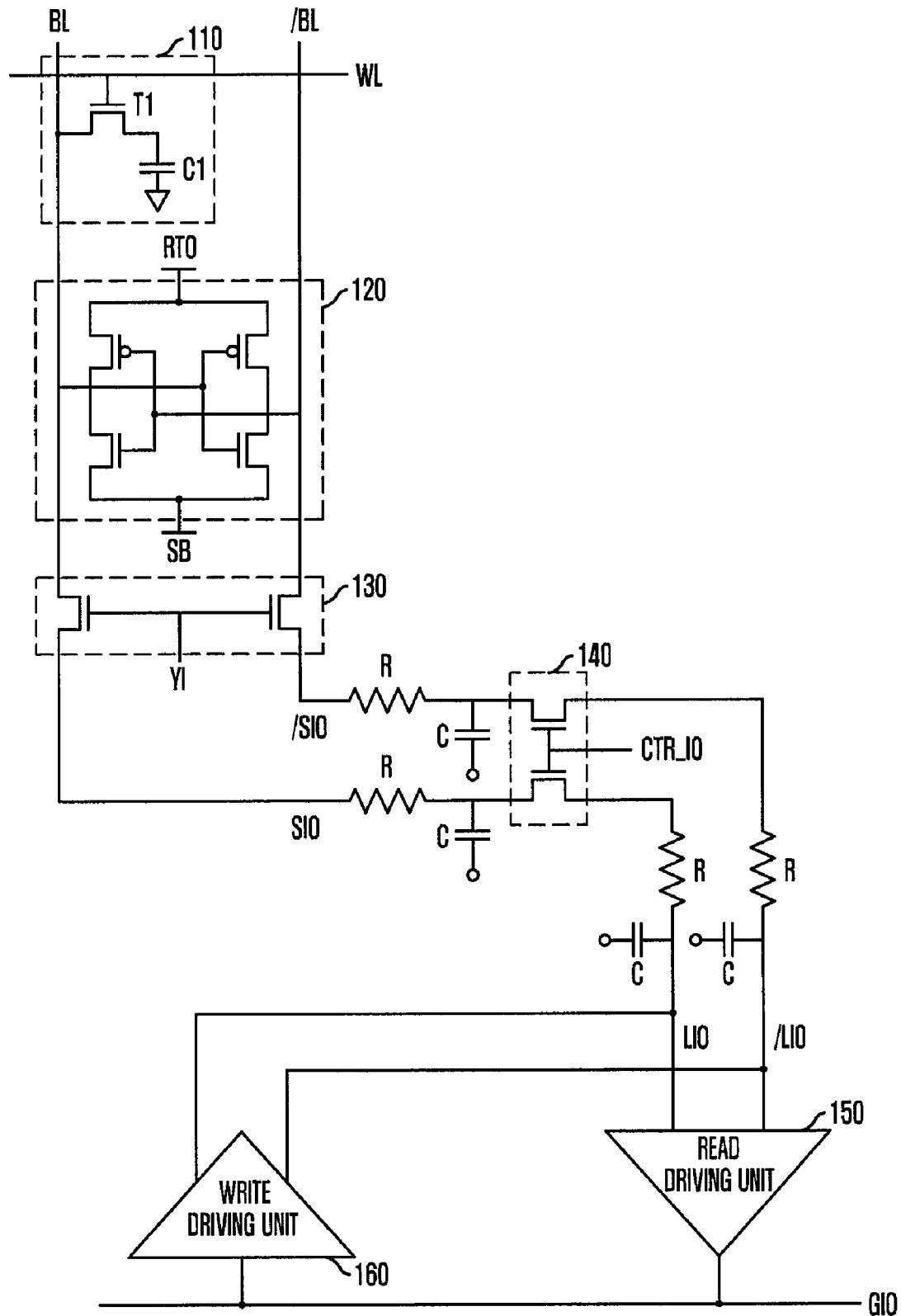
FIG. 1 is a circuit diagram showing input/output operations of a conventional semiconductor memory device.
Figure 2:
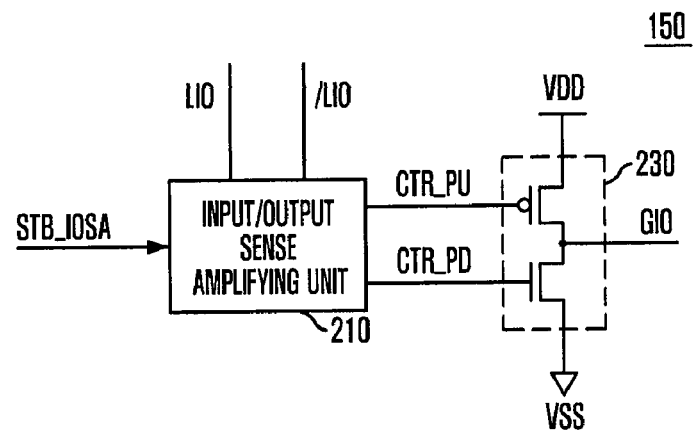
FIG. 2 is a diagram showing a read driving unit 150 of FIG. 1.
Figure 3:
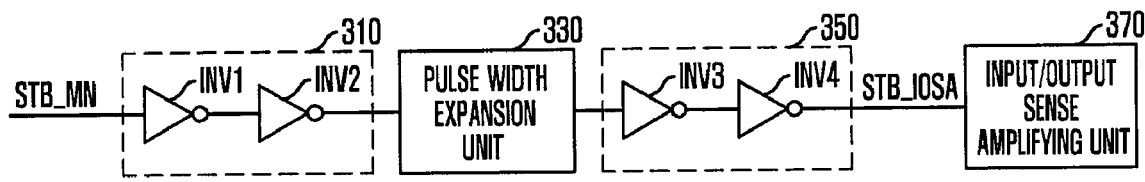
FIG. 3 is a diagram illustrating an input/output sense amplifying circuit in accordance with the present invention.

FIG. 3 is a diagram illustrating an input/output sense amplifying circuit in accordance with the present invention.

The input/output sense amplifying circuit of FIG. 3 includes an input unit 310, a pulse width expansion unit 330, an output unit 350 and an input/output sense amplifying unit 370.

The input unit 310 includes first and second inverters INV1 and INV2 to buffer a main strobe signal STB_MN. Herein, for example, the main strobe signal STB_MN may have a pulse width of 1 tCK as a pulse signal generated corresponding to read and write commands.

The pulse width expansion unit 330 receives an output signal of the input unit 310 and generates an output signal with an expanded pulse width. Herein, the output signal of the pulse width expansion unit 330 is a signal which is activated in response to an activation time of the input signal and is deactivated after a predetermined time from a deactivation time of the input signal. That is, the output signal of the pulse width expansion unit is a pulse signal in which the deactivation time is positioned behind with reference to the activation width of the input signal. For the convenience of explanation, if the main strobe signal STB_MN has an activation width at a logic "HIGH" level, the output signal of the pulse width expansion unit 330 is activated at the logic "HIGH" level at the same time of activating the main strobe signal STB_MN and may be a pulse signal with a logic "HIGH" period longer than that of the main strobe signal STB_MN.

The output unit 350 includes third and fourth inverters INV3 and INV4 to generate an input/output sense amplifying strobe signal STB_IOSA by receiving and buffering an output signal of the pulse width expansion unit 330. Finally, an activation width of the input/output sense amplifying strobe signal STB_IOSA is longer than that of the main strobe signal STB_MN.

The input/output sense amplifying unit 370 is capable of sense amplifying data applied to the main and sub input/output lines LIO and /LIO in response to the input/output sense amplifying strobe signal STB_IOSA. A detailed explanation of the input/output sense amplifying unit 370 is omitted its structure and function are to the same as those of a conventional input/output sense amplifying unit.

The reason why the activation width of the input/output sense amplifying strobe signal STB_IOSA is longer than that of the main strobe signal STB_MN is as follows.

Firstly, the semiconductor memory device is specified for various operational characteristics. Among those, there is a tCCD (CAS to CAS Delay): a minimum separation time to implement a following column access command after implementing a column access command of any bank). For example, if tCCD is 2 tCK, the main and sub local input/output lines LIO and /LIO or the main and sub segment lines SIO and /SIO are toggled at 2 tCK intervals. Inspecting this closely, 1 tCK of the 2 tCK tCCD is the time to drive data effective for the input/output lines, and the remaining 1 tCK is the time to drive the pre-charging for subsequent operations. For this, the column selection signal, the local input/output line pre-charging signal or the like should have a pulse width corresponding to the main strobe signal.

However, since the pre-charging operation is not performed for the case of the global input/output line GIO, it is possible to slightly increase the driving time. That is, it is possible to increase the activation width of the input/output sense amplifying strobe signal STB_IOSA slightly more. By increasing the activation width of the input/output sense amplifying strobe signal STB_IOSA, a sense amplifying operation is increased for the corresponding time and the global input/output line GIO is also driven for a longer time. By increasing these times, it is more likely that the data to be transferred performs a full swing. For reference, such operations can be applied for a normal mode situation except a bank grouping mode.

Hereinafter, circuits and circuit operations applied to a normal mode as well as a bank grouping mode will be explained.

A bank grouping mode has been used for a semiconductor memory device operating at high speed. The bank grouping mode is to reduce a burden of the semiconductor memory device operating at high speed above a predetermined speed as a mode to perform a logical grouping of a plurality of banks and to increase a tCCD in the case of implementing a continuous column access at the same bank in a group.

By way of example, the tCCD is fixed to 2 tCK with reference to an external clock signal regardless of the accessed bank groups in the normal mode, not in the bank grouping mode. In other words, when the column access is sequentially performed in bank groups different from each other in the normal mode, the tCCD becomes 2 tCK; and also, when the column access is continuously performed in the bank group, the tCCD becomes the 2 tCK. Whereas, when the column access is sequentially performed in bank groups different from each other in the bank grouping mode, the tCCD becomes 2 tCK similar to the normal mode; but, when the column access is continuously performed in the bank group, the tCCD is expanded to 4 tCK.

For the convenience of explanation, in case of a semiconductor memory device having a 16 bank structure of 1 gigabit, first to fourth banks are defined as a first bank group, fifth to eighth banks are defined as a second bank group, ninth to twelfth banks are defined as a third bank group and thirteenth to sixteenth banks are defined as a fourth bank group.

In case of the normal mode, for example, if a column access is performed in the first bank group, a subsequent column access is performed in the first to fourth bank groups after 2 tCK. In other words, after any bank included in the first to fourth bank groups is accessed any bank included in the first to fourth bank groups should be accessed always after 2 tCK. That is, the tCCD has the 2 tCK always regardless of the group bank being accessed.

However, in case of the bank grouping mode, for example, in order to perform the column access in the first bank group and to perform the column access again in the first bank group, 4 tCK is guaranteed; and, in order to perform the column address in the second to fourth bank groups not the first bank group, 2 tCK is guaranteed. That is, in case of performing continuous column access in the same bank group, the tCCD becomes 4 tCK; and, in case of performing sequential column access in different bank groups, the tCCD becomes 2 tCK.

The semiconductor memory device expands the activation width of the main strobe signal STB_MN from 1 tCK to 1.5 tCK in the bank grouping mode. Accordingly, the activation widths of each signal generated by using the main strobe signal STB_MN as a source are expanded, thereby improving an overall operation characteristic of the circuit. However, in case of the input/output sense amplifying strobe signal STB_IOSA, since an expanded activation width may be longer than desired by using the configuration of FIG. 3, it is preferable to have the configuration of FIG. 4. In other words, where the input/output sense amplifying strobe signal STB_MN generated at the bank grouping mode is expanded by the configuration of FIG. 3, the activation width of the input/output sense amplifying strobe signal STB_MN becomes too long; possibly causing previous data to affect following data.

Figure 4:
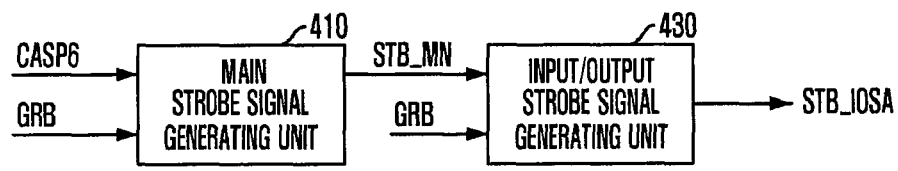
FIG. 4 is a block diagram illustrating a semiconductor memory device in accordance with the present invention.

FIG. 4 is a block diagram illustrating the semiconductor memory device in accordance with the present invention.

In FIG. 4, there is a main strobe signal generating unit 410 and an input/output strobe signal generating unit 430.

The main strobe signal generating unit 410 is capable of receiving a signal CASP6 having a pulse width corresponding to one cycle 1 tCK of an external clock signal in response to a column command and the main strobe signal STB_MN in response to a bank grouping signal GRB activated at the bank grouping mode. Herein, the main strobe signal STB_MN may have an activation width corresponding to one cycle 1 tCK during the normal mode and may have an activation width corresponding to 1.5 tCK during the bank grouping mode.

The input/output strobe signal generating unit 430 expands the activation width of the main strobe signal STB_MN in response to the bank grouping signal GRB during the normal mode to output an expanded activation width for the input/output sense amplifying strobe signal STB_IOSA and outputs as the input/output sense amplifying strobe signal STB_IOSA by maintaining the activation width of the main strobe signal STB_MN in response to the bank grouping signal GRB during the bank grouping mode.

The input/output sense amplifying strobe signal STB_IOSA generated as described above is applied to the input/output sense amplifying unit 370 of FIG. 3, thereby activating the sense amplifying operation. Accordingly, the sense amplifying unit 370 in accordance with the present invention is capable of performing a sense amplifying operation longer than a conventional sense amplifying unit by using the input/output sense amplifying strobe signal STB_IOSA which expands the main strobe signal STB_MN and is capable of also performing a sense amplifying operation longer than the conventional sense amplifying unit by using the expanded main strobe signal STB_MN input during the bank grouping mode.

Figure 5:
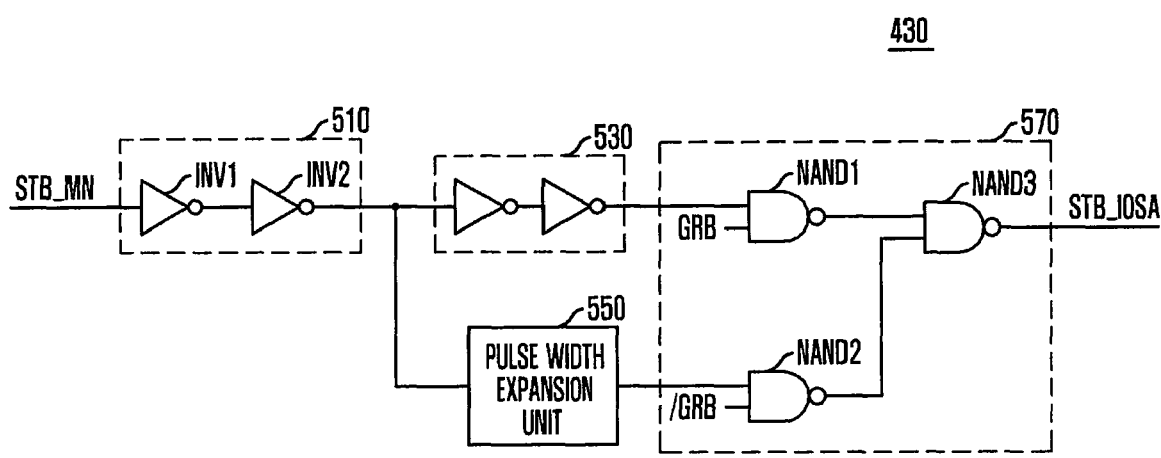
FIG. 5 is a diagram illustrating an input/output strobe signal generating unit 430 of FIG. 4.

FIG. 5 is a diagram illustrating the input/output strobe signal generating unit 430 of FIG. 4.

Referring to FIG. 5, the input/output strobe signal generating unit 430 includes an input unit 510, a dummy delay unit 530, a pulse width expansion unit 550, and a multiplexing unit 570.

The input unit 510 may have first and second inverters INV1 and INV2 to buffer the main strobe signal STB_MN.

The dummy delay unit 530 can be changed according to the design of the pulse width expansion unit 550 to model the delay time of the pulse width expansion unit 550. Alternatively, the dummy delay unit 530 can be omitted according to an operational characteristic during the normal mode.

The pulse width expansion unit 550 can expand the pulse width of an output signal of the input unit 510. Herein, the output signal of the pulse width expansion unit 550 is activated in response to the activation time of the input signal and can be deactivated after a predetermined time from the deactivation time of the input signal. That is, it becomes a pulse signal of which the deactivation time is further behind with reference to the pulse width of the input signal.

The multiplexing unit 570 is capable of outputting the output signal of the dummy delay unit 530 or the output signal of the pulse width expansion unit 550 in response to the bank grouping signal as the input/output sense amplifying strobe signal STB_IOSA. Herein, the bank grouping signal can be provided as a main bank grouping signal GRB and a sub bank grouping signal /GRB, wherein the bank grouping signal GRB and the sub bank grouping signal /GRB have opposite phases.

As illustrated, the multiplexing unit 570 includes a first NAND gate NAND1 which receives the output signal of the dummy delay unit 530 and the main bank grouping signal GRB, a second NAND gate NAND2 which receives the output signal of the pulse width expansion unit 550 and the sub bank grouping signal /GBR and a third NAND gate NAND3 that outputs the input/output sense amplifying strobe signal STB_IOSA and receives the output signals of the first NAND gate NAND1 and the second NAND gate NAND2. Therefore, the output signal of the pulse width expansion unit 550 is output as the input/output sense amplifying strobe signal STB_IOSA by making the sub bank grouping signal /GRB a logic "HIGH" during the normal mode and the output signal of the dummy delay unit 530 is output as the input/output sense amplifying strobe signal STB_IOSA by making the main bank grouping signal GRB a logic "HIGH" during the bank grouping mode.

In other words, the input/output sense amplifying strobe signal STB_IOSA is obtained by expanding the deactivation time of the main strobe signal STB_MN during the normal mode, but the main strobe signal STB_MN is not further expanded during the bank grouping mode.

Figure 6:
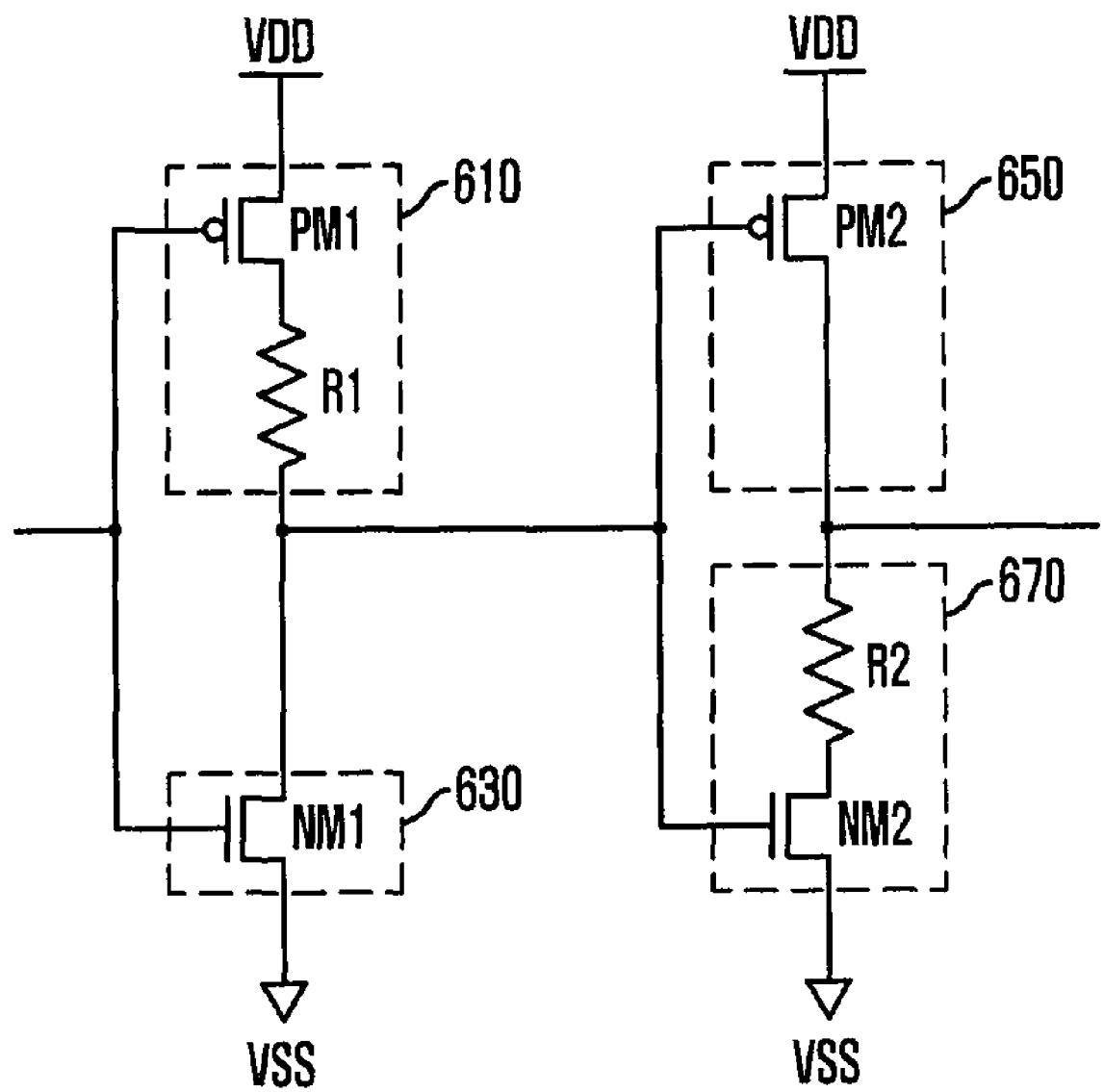
FIG. 6 is a circuit diagram illustrating a pulse width expansion unit 550 FIG. 4.

FIG. 6 is a circuit diagram illustrating the pulse width expansion unit 550 of FIG. 5.

Referring to FIG. 6, the pulse width expansion unit 550 includes first and second pull-up driving units 610 and 650 and first and second pull-down driving units 630 and 670. Such configuration corresponds to a case that the main strobe signal STB_MN has an activation width with a logic "HIGH" level. If the main strobe signal STB_MN has an activation width with a logic "LOW", a first resistor R1 is inserted into the first pull-down driving unit 630 and a second resistor R2 is inserted into the second pull-up driving unit 650.

As illustrated, the first pull-up driving unit 610 includes a first PMOS transistor PM1 and the first resistor R1 connected in series between an external voltage terminal VDD, the first pull-down driving unit 630 includes a first NMOS transistor NM1 connected between the first pull-up driving unit 610 and a ground voltage terminal VSS, the second pull-up driving unit 650 can include a second PMOS transistor PM2 connected between the external voltage terminal VDD and the second pull-down driving unit 670 includes the second resistor R2 and the second NMOS transistor NM2 connected in series between the second pull-up driving unit 650 and the ground voltage terminal VSS.

If "ON" resistances of the transistors are the same, a loading value of the first pull-up driving unit 610 becomes larger than a loading value of the first pull-down driving unit 630 by the first resistor R1 and a loading value of the second pull-down driving unit 670 becomes larger than a loading value of the second pull-up driving unit 650 by the second resistor R2.

Meanwhile, the first pull-down driving unit 630 and the second pull-up driving unit 650 are driven corresponding to the activation edge at which the main strobe signal STB_MN is activated to the logic "HIGH" and the first pull-up driving unit 610 and the second pull-down driving unit 670 are driven corresponding to the deactivation edge at which the main strobe signal STB_MN is activated to the logic "LOW". Therefore, although the activation edge of the main strobe signal STB_MN is not delayed relatively by the first pull-down driving unit 630 and the second pull-up driving unit 650, the deactivation edge of the main strobe signal STB_MN is delayed and output by the first pull-up driving unit 610 and the second pull-down driving unit 670. Thus, the output signal of the pulse width expansion unit 550 is activated in response to the activation edge of the main strobe signal STB_MN and is deactivated by delaying the deactivation edge of the main strobe signal STB_MN. The time expanded by the pulse width expansion unit 550 is designed in consideration of the activation width of the input/output sense amplifying strobe signal STB_IOSA generated thereafter. It is preferable that the activation width of the input/output sense amplifying strobe signal STB_IOSA is designed to be narrower than the tCCD.

As described above, the input/output sense amplifying strobe signal STB_IOSA in accordance with the present invention is acquired by expanding an activation width of the main strobe signal STB_MN during the normal mode, and is acquired by outputting the main strobe signal STB_MN having an expanded pulse width during the bank grouping mode. Accordingly, the sense amplifying operation can be maintained for a relatively long time as much as the activation width of the input/output sense amplifying strobe signal STB_IOSA is expanded; and also, the global input/output line GIO can be driven for a relatively long time. Thus, it is more likely that the data to be transferred performs a full swing. Finally, it can improve an overall operational characteristic of the circuit.

The present invention can obtain an effect of transferring desired data safely by performing a full swing for the data to be transferred.

And also, the present invention can obtain an effect capable of improving the characteristic of data reading operation by generating an input/output sense amplifying strobe signal having a desired activation width in a normal mode and a bank grouping mode.

While the present invention has been described with respect to the specific embodiments, it will be apparent to those skilled in the art that various changes and modifications may be made without departing from the spirit and scope of the invention as defined in the following claims.

It is also noted that the logic gates and the transistors exemplified in the above-described embodiments might be implemented differently according to, for example, the polarities of inputted signals. Such modifications are readily apparent to those skilled in the art.

What is claimed is:

1. A semiconductor memory device comprising:
a source strobe signal generating unit configured to generate a source strobe signal having a first or a second activation width corresponding to a normal mode and a bank grouping mode;
a final strobe signal generating unit configured to, in the normal mode, expand the first activation width and generate a final strobe signal having the expanded first activation width, and in the bank grouping mode, maintain the second activation width and generate the final strobe signal having the second activation width; and a sense amplifying unit configured to sense, amplify and output data applied through a data line in response to the final strobe signal.

2. The semiconductor memory device as recited in claim 1, further comprising a driving unit that drives a global data line in response to an output signal of the sensing amplifying unit.

3. The semiconductor memory device as recited in claim 1, wherein the second activation width is wider than the first activation width.

4. The semiconductor memory device as recited in claim 1, wherein an activation width of the final strobe signal is shorter than a minimum separation time between a column command and a following column command.

5. The semiconductor memory device as recited in claim 1, wherein the final strobe signal generating unit includes:
   an expanding unit configured to expand an activation width of the source strobe signal to generate an expanded output signal; and
   a multiplexing unit configured to output a source strobe signal or the expanded output signal of the expanding unit as the final strobe signal in response to the bank grouping mode.

6. The semiconductor memory device as recited in claim 5, wherein the expanding unit expands a deactivation time of the source strobe signal.

7. The semiconductor memory device as recited in claim 5, wherein the expanding unit includes:
   a first driving unit configured to be driven corresponding to an activation edge of the source strobe signal; and
   a second driving unit configured to be driven corresponding to a deactivation edge of the source strobe signal,
   wherein a loading value of the first driving unit is smaller than a loading value of the second driving unit.

8. A method for driving a semiconductor memory device, comprising:
   expanding an activation width of a source strobe signal having a first activation width corresponding to a normal mode and outputting the source strobe signal having an expanded first activation width as a final strobe signal;
   maintaining a second activation width of the source strobe signal corresponding to a bank grouping mode and outputting the source strobe signal having the second activation width as the final strobe signal; and
   sensing, amplifying and outputting data in response to the final strobe signal.

9. The method as recited in claim 8, further comprising: generating the source strobe signal having the first activation width corresponding to the normal mode; and
   generating the source strobe signal having the second activation width corresponding to the bank grouping mode.

10. The method as recited in claim 8, wherein the second activation width is wider than the first activation width.

11. The method as recited in claim 8, wherein an activation width of the final strobe signal is shorter than a minimum separation time between a column command and a following column command.

12. The method as recited in claim 8, wherein the step of generating the final strobe signal includes:
   expanding the activation width of the source strobe signal; and selectively outputting the source strobe signal or the expanded source strobe signal as the final strobe signal in response to the bank grouping mode.

13. The method as recited in claim 12, wherein the expansion of the activation width of the source strobe signal is acquired by expanding a deactivation time of the source strobe signal.

14. A data sense amplifying circuit comprising:
   a pulse width expansion unit configured to generate an input/output sense amplifying strobe signal by expanding an activation width of a received main strobe signal; and
   a sense amplifying unit configured to amplify and output the data applied to a local data line in response to the input/output sense amplifying strobe signal.

15. The data sense amplifying circuit as recited in claim 14, wherein the pulse width expansion unit expands a deactivation time of the main strobe signal.

16. The data sense amplifying circuit as recited in claim 14, wherein an activation width of the input/output sense amplifying strobe signal is shorter than a minimum separation time between a column command and a following column command.

17. The data sense amplifying circuit as recited in claim 14, wherein the pulse width expansion unit includes:
   a first driving unit configured to be driven corresponding to an activation edge of the main strobe signal; and
   a second driving unit configured to be driven corresponding to a deactivation edge of the main strobe signal,
   wherein a loading value of the first driving unit is smaller than a loading value of the second driving unit.

18. A semiconductor memory device comprising:
   a source strobe signal generating unit configured to generate a source strobe signal having a first pulse width in response to a read command;
   a final strobe signal generating unit configured to, during the normal mode, generate a final strobe signal having the first activation pulse width, and during the bank grouping mode, expand the first activation pulse width and generate the final strobe signal having the expanded activation pulse width; and
   a sense amplifying unit configured to sense, amplify and output data applied through a data line in response to the final strobe signal.

19. The semiconductor memory device as recited in claim 18, further comprising a driving unit that drives a global data line in response to an output signal of the sensing amplifying unit.

* * * * *